(12) United States Patent
Burra et al.

(10) Patent No.: US 12,375,063 B2
(45) Date of Patent: *Jul. 29, 2025

(54) DYNAMIC BAND STEERING FILTER BANK DIE

(71) Applicant: Qorvo US, Inc., Greensboro, NC (US)

(72) Inventors: Gangadhar Burra, Fremont, CA (US); Bror Peterson, Fairview, TX (US); Richard Perkins, Encinitas, CA (US); Chris Levesque, Fountain Valley, CA (US)

(73) Assignee: Qorvo US, Inc., Greensboro, NC (US)

( * ) Notice: Subject to any disclaimer, the term of this patent is extended or adjusted under 35 U.S.C. 154(b) by 212 days.

This patent is subject to a terminal disclaimer.

(21) Appl. No.: 17/342,957

(22) Filed: Jun. 9, 2021

(65) Prior Publication Data

US 2022/0399876 A1     Dec. 15, 2022

(51) Int. Cl.
*H03H 9/60* (2006.01)
*H03F 3/24* (2006.01)
*H03H 9/54* (2006.01)

(52) U.S. Cl.
CPC .............. *H03H 9/605* (2013.01); *H03F 3/245* (2013.01); *H03H 9/545* (2013.01); *H03F 2200/294* (2013.01); *H03F 2200/451* (2013.01)

(58) Field of Classification Search
CPC ............... H03F 3/245; H03F 2200/294; H03F 2200/451; H03H 9/545; H03H 9/605
See application file for complete search history.

(56) References Cited

U.S. PATENT DOCUMENTS

| | | | |
|---|---|---|---|
| 4,296,391 A | 10/1981 | Hazama et al. | |
| 5,955,933 A | 9/1999 | Nishihara et al. | |
| 6,351,539 B1* | 2/2002 | Djakovic | H04L 9/0625 380/46 |
| 6,373,350 B1 | 4/2002 | Fujita | |
| 7,057,472 B2 | 6/2006 | Fukamachi et al. | |
| 9,608,595 B1 | 3/2017 | Raihn et al. | |
| 10,298,299 B1* | 5/2019 | Duxbury | H04B 7/0691 |
| 10,826,543 B2 | 11/2020 | Ella | |
| 11,356,133 B1 | 6/2022 | Hasnain et al. | |
| 11,576,248 B2 | 2/2023 | Wallis et al. | |
| 11,616,490 B2 | 3/2023 | Kim et al. | |
| 2004/0032706 A1 | 2/2004 | Kemmochi et al. | |
| 2005/0007196 A1 | 1/2005 | Gresham | |
| 2005/0208918 A1 | 9/2005 | Rowe et al. | |
| 2006/0067254 A1 | 3/2006 | Mahbub et al. | |

(Continued)

FOREIGN PATENT DOCUMENTS

WO         2023051219 A1     4/2023

OTHER PUBLICATIONS

U.S. Appl. No. 17/342,948, filed Jun. 9, 2021.

(Continued)

*Primary Examiner* — Quan Tra
(74) *Attorney, Agent, or Firm* — Withrow & Terranova, P.L.L.C.

(57) ABSTRACT

Disclosed is a filter bank die having a first acoustic wave (AW) filter having a first antenna terminal and a first filter terminal, and a second AW filter having a second filter terminal, and a second antenna terminal coupled to the first antenna terminal to effectively diplex signals that pass through the first AW filter and the second AW filter.

29 Claims, 7 Drawing Sheets

(56) References Cited

U.S. PATENT DOCUMENTS

| | | |
|---|---|---|
| 2007/0223615 A1 | 9/2007 | Dosanjh et al. |
| 2008/0224790 A1 | 9/2008 | Tajima et al. |
| 2015/0229463 A1* | 8/2015 | Oh ............................ H04B 1/48 |
| | | 370/278 |
| 2016/0218767 A1 | 7/2016 | Li et al. |
| 2016/0269001 A1 | 9/2016 | Lee et al. |
| 2016/0285503 A1 | 9/2016 | Poulin et al. |
| 2019/0115947 A1* | 4/2019 | Nosaka ..................... H04B 1/50 |
| 2019/0319606 A1 | 10/2019 | Ando et al. |
| 2019/0372632 A1 | 12/2019 | Duxbury et al. |
| 2020/0136592 A1 | 4/2020 | Nosaka |
| 2020/0195227 A1 | 6/2020 | Takamine |
| 2020/0228096 A1* | 7/2020 | Shen ....................... H03H 9/542 |
| 2020/0313753 A1* | 10/2020 | Schwartz ................... H04L 5/14 |
| 2020/0336132 A1* | 10/2020 | Matsubara ............... H03H 7/38 |
| 2020/0382208 A1 | 12/2020 | Hormis et al. |
| 2021/0006272 A1 | 1/2021 | Takeuchi |
| 2021/0135655 A1 | 5/2021 | Fukuhara et al. |
| 2021/0135690 A1* | 5/2021 | Pehlke ..................... G01S 19/36 |
| 2021/0217713 A1 | 7/2021 | Wallis et al. |
| 2021/0242853 A1 | 8/2021 | Mori |
| 2021/0336597 A1 | 10/2021 | Kocer et al. |
| 2022/0123719 A1 | 4/2022 | Burak et al. |
| 2022/0271734 A1 | 8/2022 | Abbott et al. |
| 2023/0077767 A1 | 3/2023 | Beaudin et al. |
| 2023/0083961 A1 | 3/2023 | Komatsu et al. |
| 2023/0223963 A1 | 7/2023 | Ikeuchi |

OTHER PUBLICATIONS

U.S. Appl. No. 17/342,966, filed Jun. 9, 2021.
U.S. Appl. No. 17/342,970, filed Jun. 9, 2021.
Non-Final Office Action for U.S. Appl. No. 17/342,970, mailed Feb. 17, 2023, 20 pages.
Notice of Allowance and Examiner-Initiated Interview Summary for U.S. Appl. No. 17/342,970, mailed May 26, 2023, 11 pages.
Non-Final Office Action for U.S. Appl. No. 17/342,948, mailed Dec. 8, 2023, 30 pages.
Notice of Allowance for U.S. Appl. No. 17/342,966, mailed Oct. 5, 2023, 9 pages.
Non-Final Office Action for U.S. Appl. No. 17/342,970, mailed Oct. 27, 2023, 29 pages.
Final Office Action for U.S. Appl. No. 17/342,948, mailed Apr. 1, 2024, 23 pages.
Notice of Allowance and Examiner-Initiated Interview Summary for U.S. Appl. No. 17/342,970, mailed Feb. 15, 2024, 10 pages.
Notice of Allowance for U.S. Appl. No. 17/342,948, mailed Jun. 13, 2024, 9 pages.

* cited by examiner

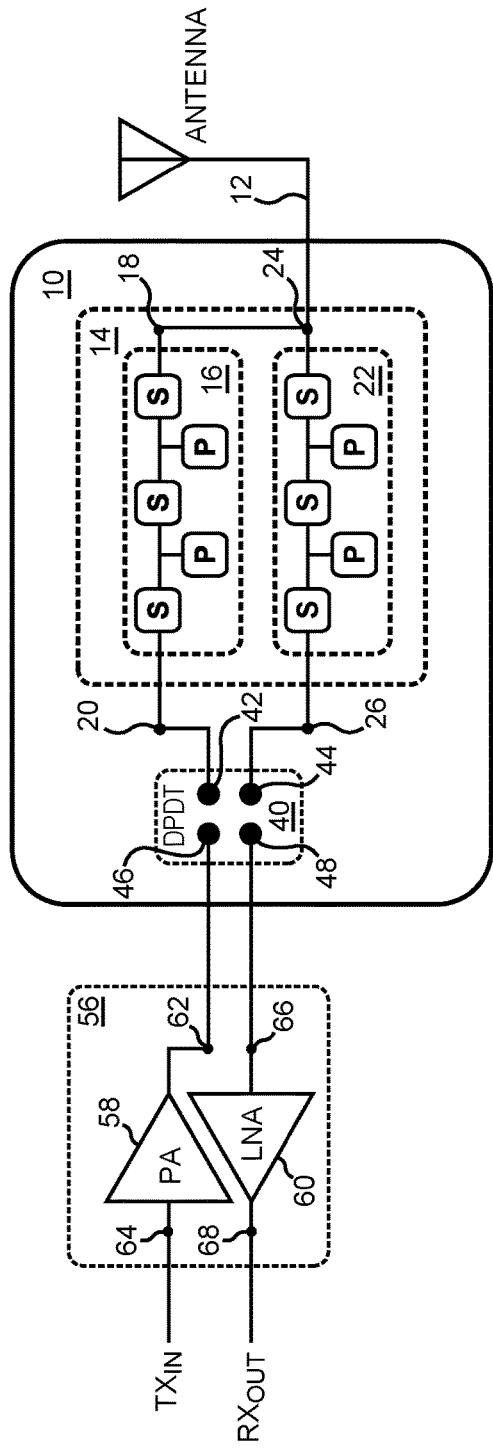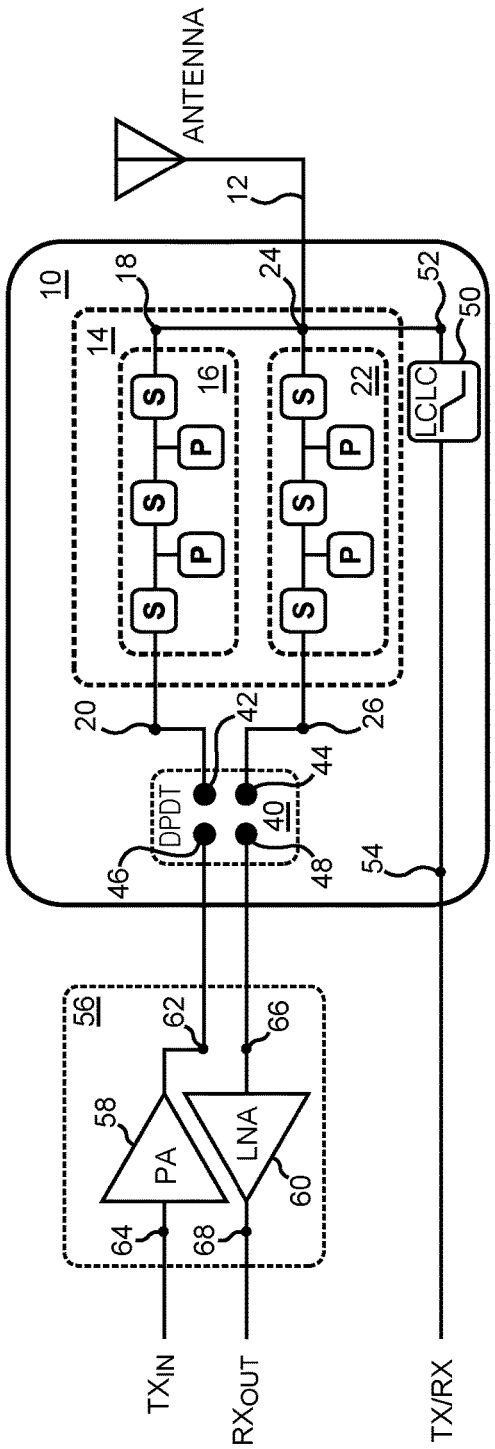

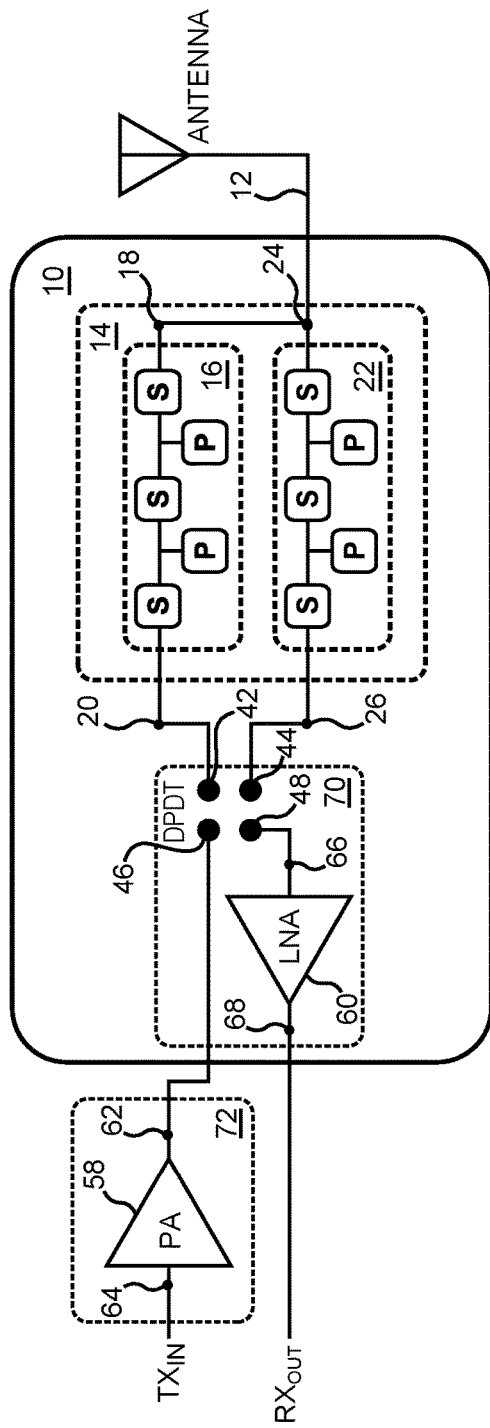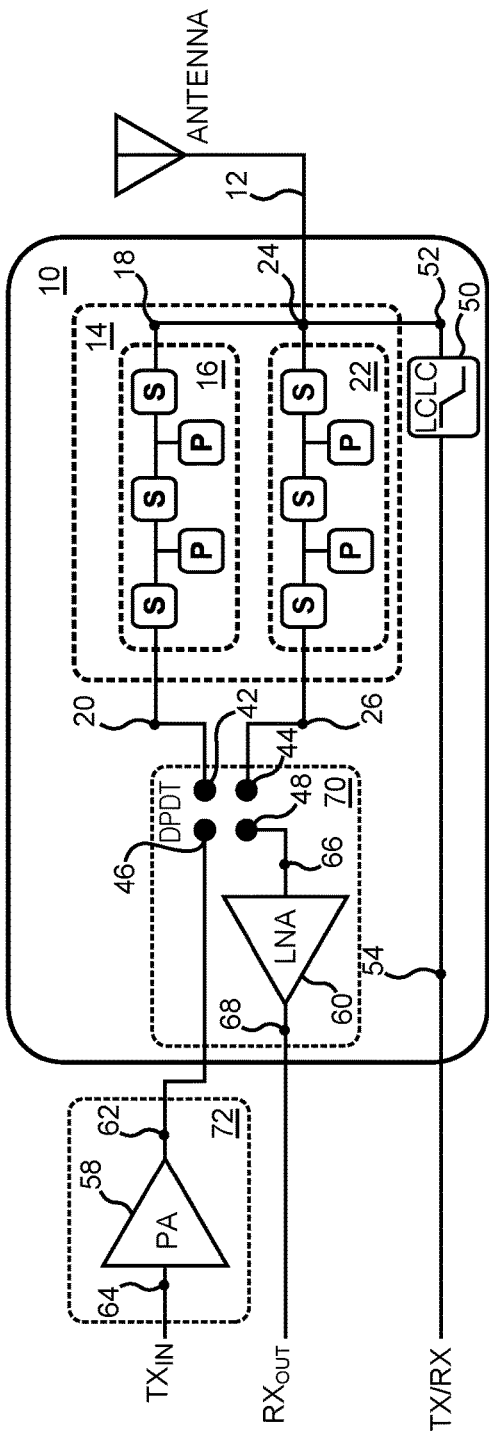

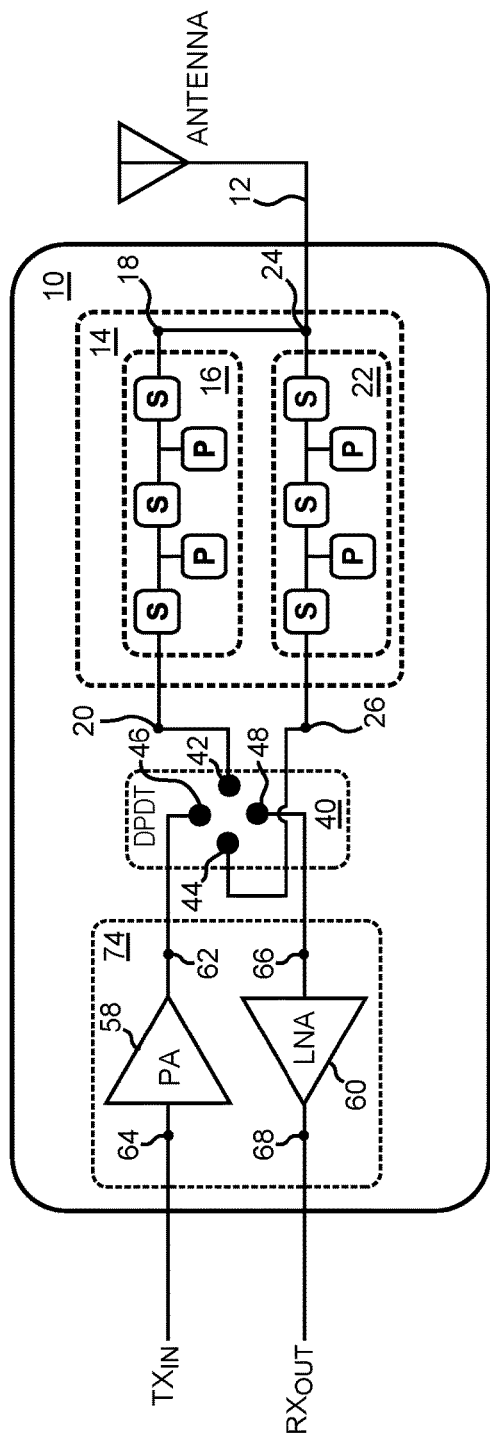
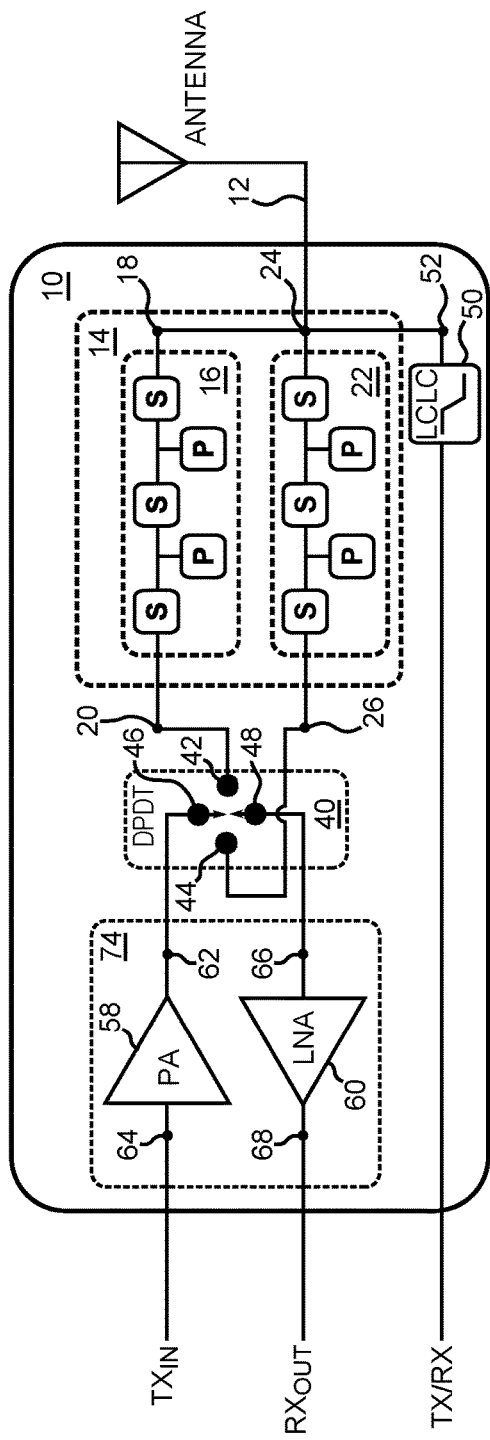

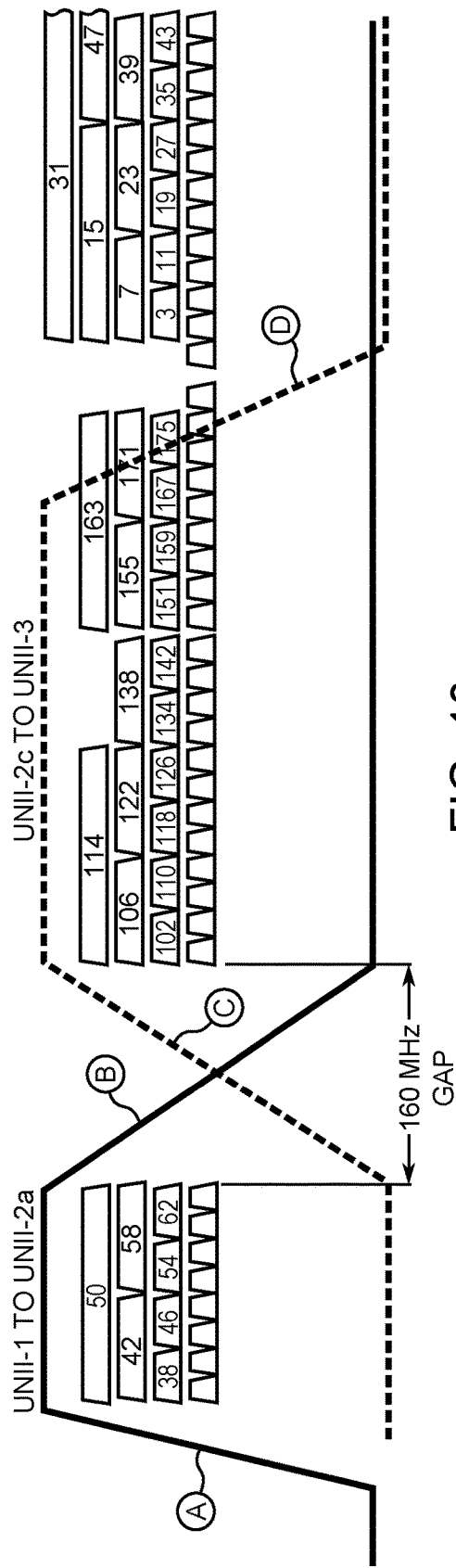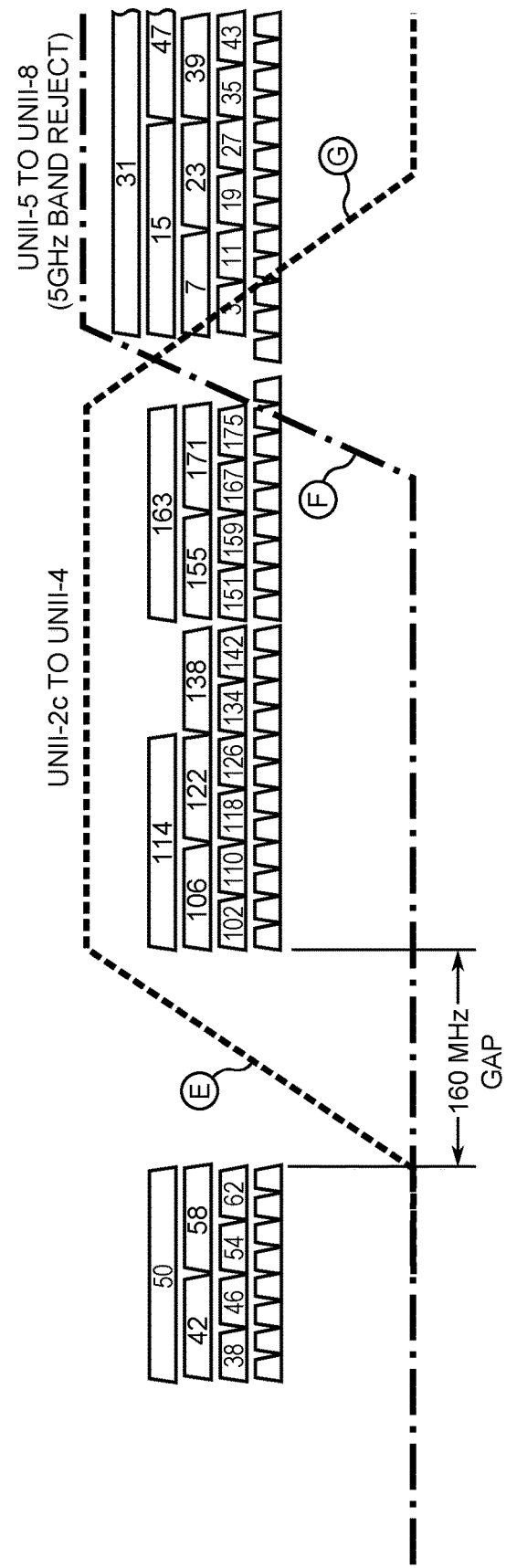
FIG. 13
FIG. 14

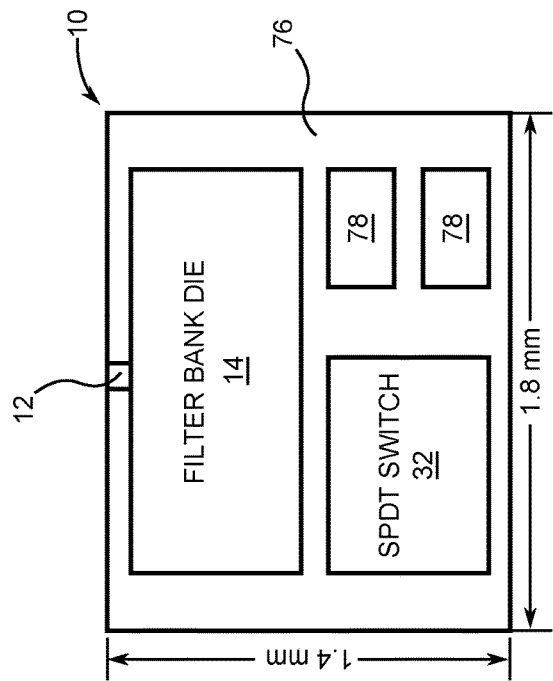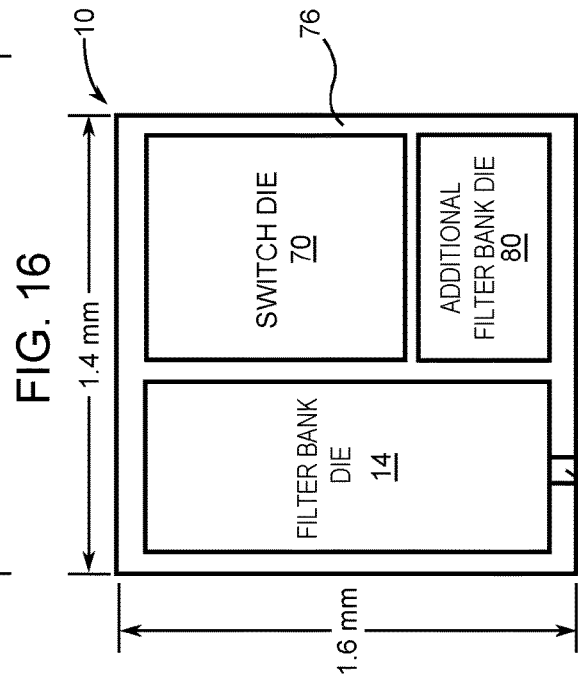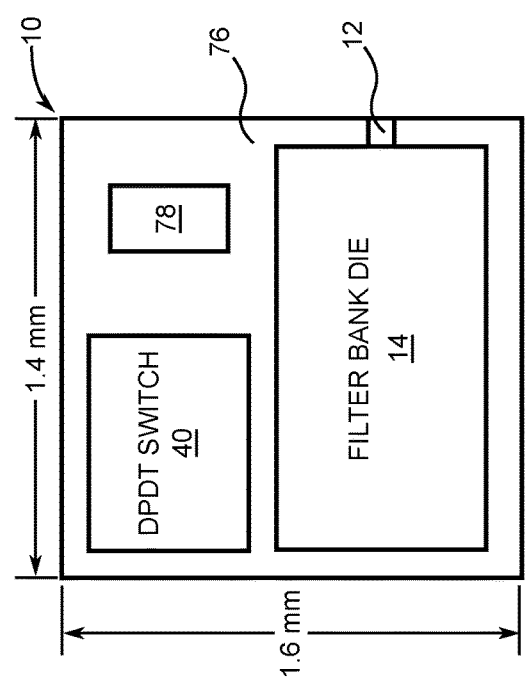

DYNAMIC BAND STEERING FILTER BANK DIE

RELATED APPLICATIONS

This application is related to U.S. patent application Ser. No. 17/342,948, filed Jul. 9, 2021, now U.S. Pat. No. 12,149,230; U.S. patent application Ser. No. 17/342,966, filed Jul. 9, 2021, now U.S. Pat. No. 11,916,541; and U.S. patent application Ser. No. 17/342,970, filed Jul. 9, 2021, now U.S. Pat. No. 12,015,430; the disclosures of which are hereby incorporated herein by reference in their entireties.

FIELD OF THE DISCLOSURE

The present disclosure relates in general to radio frequency processing. In particular, the present disclosure relates to filter bank modules.

BACKGROUND

To support the newly released Wireless Fidelity (Wi-Fi) spectrum at 6 GHz while supporting the existing Wi-Fi bands at 2.4 GHz and 5 GHz, customers use complex banks of filters, along with switches, diplexers, and an assortment of surface-mount technology matching components. As such, filter bank modules incorporating these components are relatively large in size and have relatively high cost and relatively poor performance. What is needed is a new type of filter bank module having a substantial reduction in size and cost while also substantially improving performance.

SUMMARY

Disclosed is a filter bank die having a first acoustic wave (AW) filter having a first antenna terminal and a first filter terminal, and a second AW filter having a second filter terminal, and a second antenna terminal coupled to the first antenna terminal to effectively diplex signals that pass through the first AW filter and the second AW filter.

In some exemplary embodiments, at least one switch such as a single-pole double-throw switch or a multi-pole multi-throw switch is integrated within a filter bank module with the filter bank die. Also, in some exemplary embodiments, a low-noise amplifier is integrated with the switch and the filter bank die within the filter bank module. In further exemplary embodiments, a power amplifier is integrated with the low-noise amplifier, the switch, and the filter bank die within the filter bank module. Moreover, passive filters such as inductor-capacitor filters may also be integrated with any of the exemplary embodiments.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

FIG. 7 is a schematic of yet another exemplary embodiment of the filter bank module depicting an external amplifier die coupled to the exemplary embodiment of filter bank module depicted in FIG. 3.

FIG. 8 is a schematic depicting the external amplifier die of FIG. 7 coupled to the exemplary embodiment of filter bank module that integrates the passive filter as depicted in FIG. 6.

FIG. 9 is a schematic depicting another exemplary embodiment of the filter bank module in which a switch die integrates the LNA with the double-pole double-throw switch within the filter module.

FIG. 10 is a schematic depicting yet another exemplary embodiment of the filter bank module in which the switch die integrates the LNA and the double-pole double-throw switch with the passive filter within the filter module.

FIG. 11 is a schematic depicting another exemplary embodiment of the filter bank module in which an internal power amplifier (PA) die that is equivalent to the external power amplifier die (FIGS. 8 and 9) is integrated with the double-pole double-throw switch within the filter bank module.

FIG. 12 is a schematic depicting yet another exemplary embodiment of the filter bank module in which the internal power amplifier die is integrated within the filter bank module along with the double-pole double-throw switch and the passive filter.

FIG. 13 is a spectrum graph depicting an Unlicensed National Information Infrastructure bands 1 to 2a (UNII-1 to UNII-2a) passband and a UNII-2c to UNII-3 passband having skirts in accordance with the present disclosure.

FIG. 14 is a spectrum graph depicting a UNII-2c to UNII-4 passband and a UNII-5 to UNII-8 passband having skirts in accordance with the present disclosure.

FIG. 15 is a packaging diagram of a first exemplary embodiment of filter bank module of the present disclosure.

FIG. 16 is a packaging diagram of a second exemplary embodiment of filter bank module of the present disclosure.

FIG. 17 is a packaging diagram of a third exemplary embodiment of filter bank module of the present disclosure.

FIG. 18 is a packaging diagram of a fourth exemplary embodiment of filter bank module of the present disclosure.

DETAILED DESCRIPTION

Figure 1:
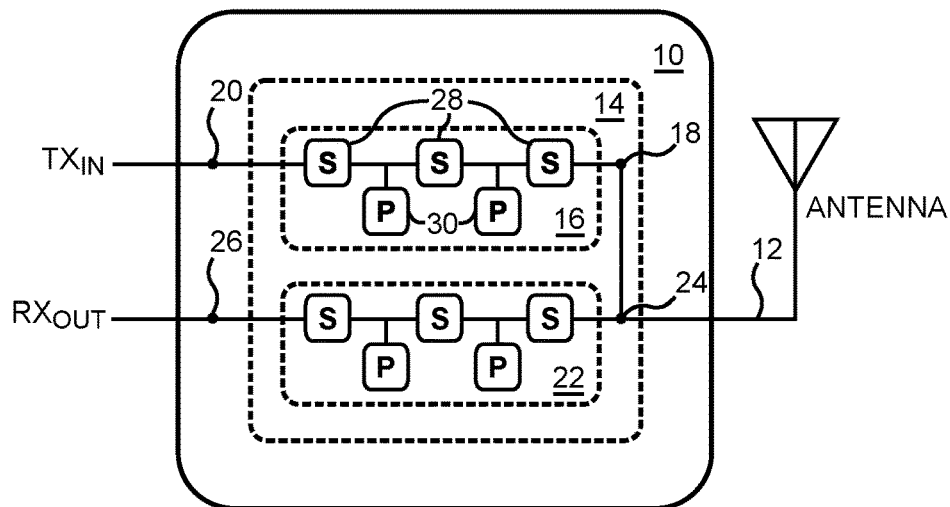
FIG. 1 is a schematic of an exemplary embodiment of a filter bank module that is structured in accordance with the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Embodiments of a filter bank module having structures according to the present disclosure reduce module size and module cost while increasing performance. In general, integrating multiple filter passbands onto a single acoustic wave (AW) die reduces module size and module cost. Moreover, outputs of the multiple filter passbands are diplexed together to eliminate the use of a switch. Lastly, the allocation of the passbands in the filter banks is also unique and allows the best flexibility in terms of concurrent scenarios between the multiple bands. This filter passband allocation also allows filter skirts to be optimized. The disclosed embodiments of the filter bank module reduce the insertion loss (IL) of the AW filters and reduce the size of the filter die. The steepness of the transition between the low IL corner and high rejection corner are referred to as the skirt, so a lower steepness skirt is relatively easier to realize and has lower IL. The AW filters of the present disclosure may be constructed from various types of acoustic wave resonators. For example, AW resonators such as surface acoustic wave (SAW) resonators and/or bulk acoustic wave (BAW) resonators are employable with the present disclosure. Therefore, the AW filters of the present disclosure may be of the SAW type and/or the BAW type.

FIG. 1 is a schematic of an exemplary embodiment of a filter bank module 10 that is structured in accordance with the present disclosure. The filter module 10 has an antenna port terminal 12 and a filter bank die 14. The filter bank die 14 includes a first acoustic wave (AW) filter 16 having a first antenna terminal 18 coupled to the antenna port terminal 12 and a first filter terminal 20, and a second AW filter 22 having a second antenna terminal 24 coupled to the first antenna terminal 18 to effectively diplex signals that pass through the first AW filter 16 and the second AW filter 22. The second AW filter further includes a second filter terminal 26. Boxes labeled S represent series AW resonators 28 and boxes labeled P are parallel AW resonators 30 in both the first AW filter 16 and the second AW filter 22. It is to be understood that embodiments may have more or less of the P resonators and S resonators. Also, the first and/or last S resonators may or may not be present. The first antenna terminal 18 and the second antenna terminal 24 are directly coupled together in exemplary embodiments of the present disclosure. The effective duplexing of signals that pass through the first AW filter 16 and the second AW filter 22 eliminates need for an output switch and/or a physical diplexer. As such, the filter module 10 has reduced size, reduced cost, and reduced insertion relative to traditional filtering schemes.

Figure 2:
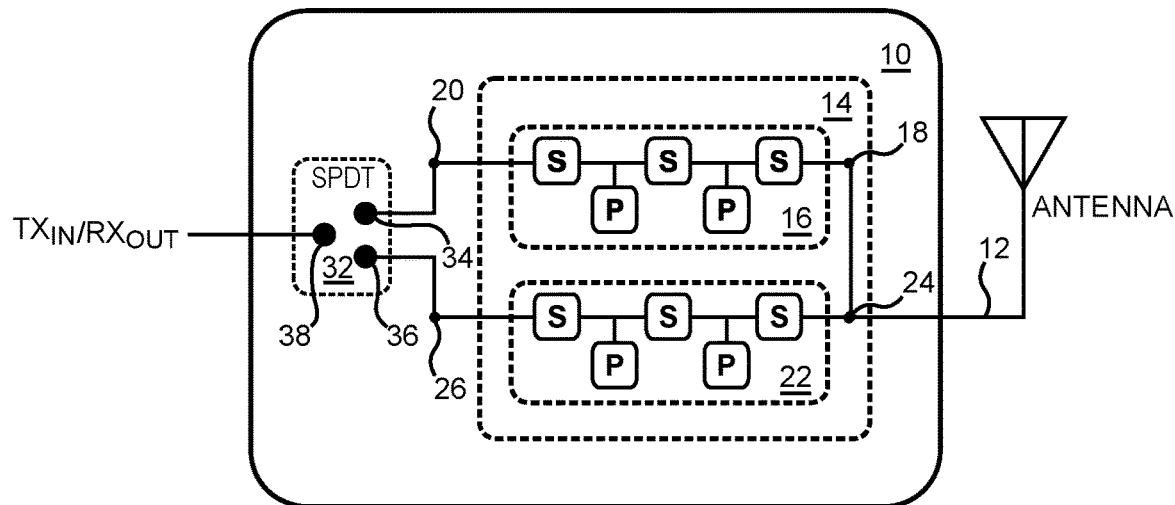
FIG. 2 is a schematic of another exemplary embodiment of the filter bank module in which a single-pole double-throw switch is integrated.

FIG. 2 is a schematic of another exemplary embodiment of the filter bank module 10 in which a single-pole double-throw switch 32 is integrated. The single-pole double-throw switch 32 has a first throw terminal 34 coupled to the first filter terminal 20 and a second throw terminal 36 coupled to the second filter terminal 26 and a single pole terminal 38.

Figure 3:
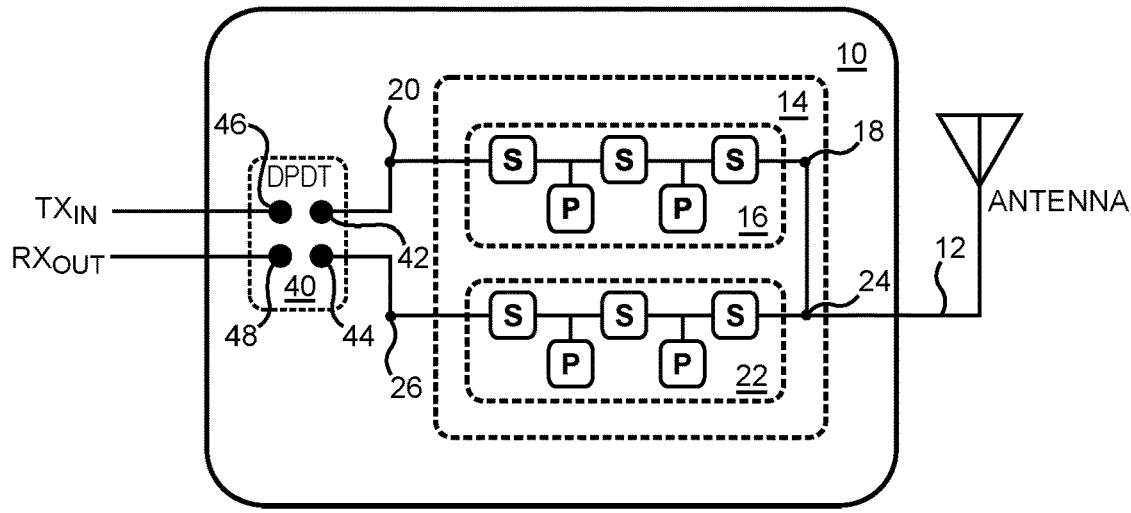
FIG. 3 is a schematic of yet another exemplary embodiment of the filter bank module in which a double-pole double-throw switch is integrated.

FIG. 3 is a schematic of yet another exemplary embodiment of the filter bank module 10 in which a double-pole double-throw switch 40 having a first throw terminal 42 coupled to the first filter terminal 20 and a second throw terminal 44 coupled to the second filter terminal 26, a transmit pole terminal 46, and a receive pole terminal 48.

Figure 4:
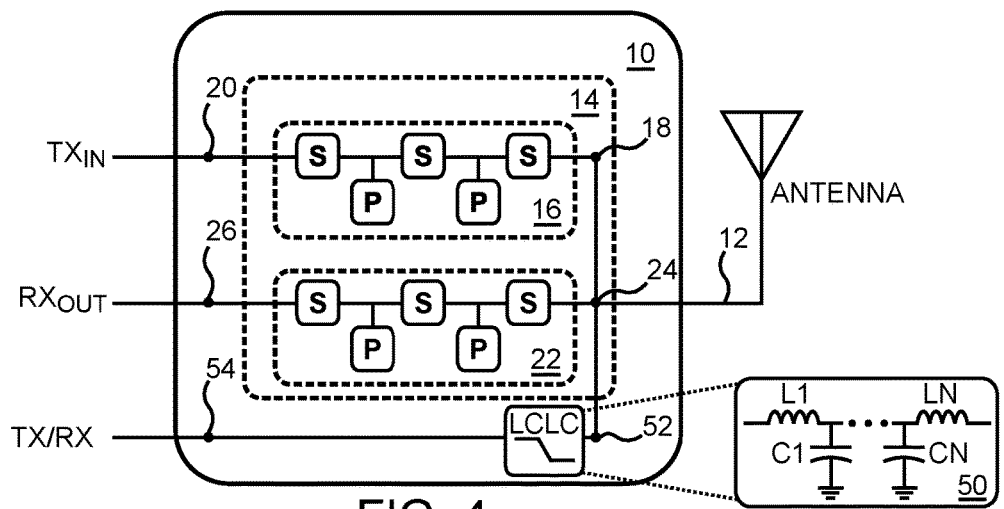
FIG. 4 is a schematic of an exemplary embodiment of the filter bank module that includes a passive filter.

FIG. 4 is a schematic of an exemplary embodiment of the filter bank module 10 that includes a passive filter 50 having a third antenna terminal 52 coupled to the antenna port terminal 12 and a third filter terminal 54. The passive filter 50 in the exemplary embodiment of FIG. 4 is an inductor-capacitor-inductor-capacitor (LCLC) type filter and is depicted in greater detail in the outset of FIG. 4. In this case a first inductor L1 and a first capacitor C1 are coupled is a series-parallel configuration to realize the passive filter 50. It is to be understood that the LCLC filter 50 may be replaced with an AW filter or other type of RF filter.

Figure 5:
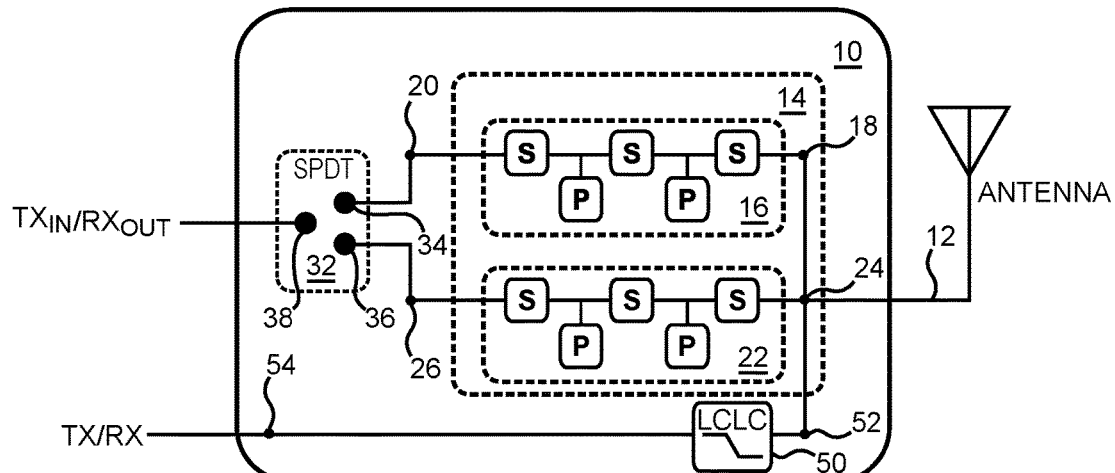
FIG. 5 is a schematic of another exemplary embodiment of the filter bank module in which the single-pole double-throw switch and the passive filter are both integrated.
Figure 6:
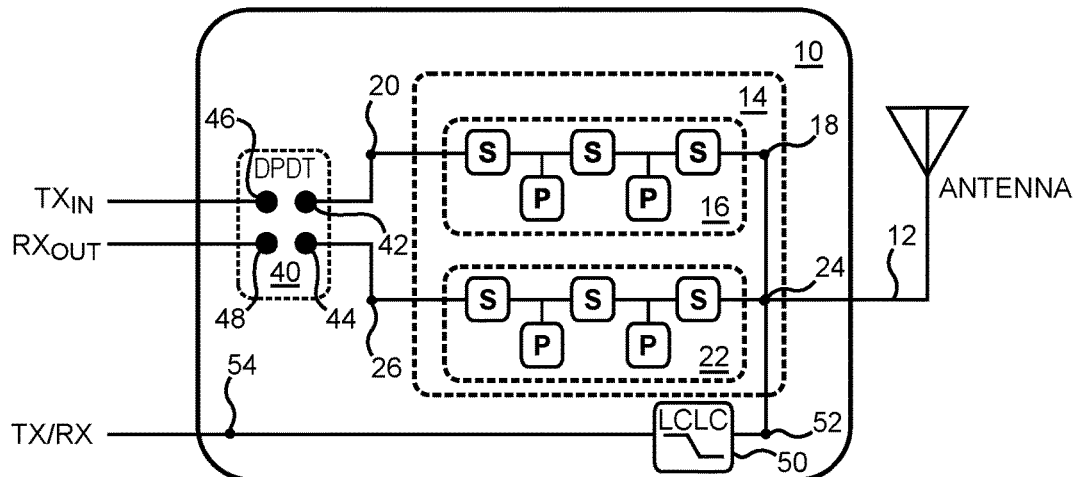
FIG. 6 is a schematic of another exemplary embodiment of the filter bank module in which the double-pole double-throw switch and the passive filter are both integrated.

FIG. 5 is a schematic of another exemplary embodiment of the filter bank module 10 in which the single-pole double-throw switch 32 and the passive filter 50 are both integrated. FIG. 6 is a schematic of another exemplary embodiment of the filter bank module 10 in which the double-pole double-throw switch 40 and the passive filter 50 are both integrated.

FIG. 7 is a schematic of yet another exemplary embodiment of the filter bank module 10 depicting an external amplifier die 56 coupled to the exemplary embodiment of filter bank module 10 depicted in FIG. 3. The external amplifier die 56 integrates a power amplifier (PA) 58 and a low noise amplifier (LNA) 60. The PA 58 has a PA output 62 coupled to the transmit pole terminal 46 and a PA input 64 coupled to a transmit signal input TX$_{IN}$. The LNA 60 has an LNA input terminal 66 coupled to the receive pole terminal 48 and an LNA output terminal 68 coupled to a receive signal output RX$_{OUT}$. The PA 58 may be implemented using various semiconductor processes such as gallium arsenide, silicon germanium, and gallium nitride. FIG. 8 is a schematic depicting the external amplifier die 56 coupled to the exemplary embodiment of filter bank module 10 that integrates the passive filter 50 as depicted in FIG. 6.

FIG. 9 is a schematic depicting another exemplary embodiment of the filter bank module 10 in which a switch die 70 integrates the LNA 60 with the double-pole double-throw switch 40 within the filter module 10. An external PA die 72 includes the PA 58. The PA output 62 is coupled to the transmit pole terminal 46, and the PA input 64 is coupled to the transmit signal input TX$_{IN}$. FIG. 10 is a schematic depicting yet another exemplary embodiment of the filter bank module 10 in which the switch die 70 integrates the LNA 60 and the double-pole double-throw switch 40 with the passive filter 50 within the filter module 10.

FIG. 11 is a schematic depicting another exemplary embodiment of the filter bank module 10 in which an internal PA die 74 that is equivalent to the external PA die 56 (FIGS. 8 and 9) is integrated with the double-pole double-throw switch 40 within the filter bank module 10.

FIG. 12 is a schematic depicting yet another exemplary embodiment of the filter bank module 10 in which the internal PA die 74 is integrated within the filter bank module 10 along with the double-pole double-throw switch 40 and the passive filter 50. In both embodiments depicted in FIG. 11 and FIG. 12, the double-pole double-throw switch 40 is configured to selectively couple the receive pole terminal 48 between the first throw terminal 42 and the second throw terminal 44. Further, in these embodiments, the double-pole double-throw switch 40 is also configured to selectively couple the transmit pole terminal 46 between the first throw terminal 42 and the second throw terminal 44. In some embodiments, an insertion loss between either of the transmit pole terminal 46 or the receive pole terminal 48 and the antenna port terminal 12 minus the insertion loss of either the first AW filter 16 or the second AW filter 22 is no greater than 1.2 decibels.

FIG. 13 is a spectrum graph depicting a Unlicensed National Information Infrastructure bands 1 to 2a (UNII-1 to UNII-2a) passband and a UNII-2c to UNII-3 passband having skirts in accordance with the present disclosure. A skirt is defined as steepness of the transition between the low IL corner and high rejection corner of a passband. A lower steepness skirt is relatively easier to realize and has a lower insertion loss. Filtering of the spectrum represented in the graph of FIG. 13 is realized by the filter bank die 14 (FIGS. 1-7) in some embodiments. For example, the UNII-1 to UNII-2a passband depicted in FIG. 13 in thick solid line may be realized by the first AW filter 16, while the UNII-2c to UNII-3 passband depicted in FIG. 13 in thick dashed line may be realized by the second AW filter 22. The UNII-1 to UNII-2a passband has a rising skirt labeled A and a falling skirt labeled B. In accordance with the present disclosure, the falling skirt B of the UNII-1 to UNII-2a passband has a relatively shallow slope or roll-off in comparison with the relatively steep slope of the rising skirt A. In this case, the falling skirt B has been given a substantially shallower slope by spanning up to a 160 MHz gap in spectrum. As such, in accordance with the present disclosure, the first AW filter 14 is structured to provide the shallower slope of a falling skirt labeled D by taking advantage of the up to 160 MHz gap.

In contrast, a rising skirt labeled C of the UNII-2c to UNII-3 passband has a relatively shallow slope in comparison with the falling skirt D of the UNII-2c to UNII-3 passband. In this case, the rising skirt C has been given a substantially shallower slope by spanning up to a 160 MHz gap in spectrum. As such, in accordance with the present disclosure, the second AW filter 22 is structured to provide the shallower slope of the rising skirt D by taking advantage of the up to 160 MHz gap. This skirt management configured into the first AW filter 14 and the second AW 22 provides advantages of at least smaller physical size, lower cost, and lower insertion loss in comparison with contemporary filter modules.

FIG. 14 is a spectrum graph depicting a UNII-2c to UNII-4 passband and a UNII-5 to UNII-8 passband having skirts in accordance with the present disclosure. Filtering of the spectrum represented in the graph of FIG. 14 is realized by the filter bank die 14 (FIGS. 1-7) in some embodiments. For example, the UNII-2c to UNII-4 passband depicted in FIG. 14 in thick dashed line may be realized by the first AW filter 16, while the UNII-5 to UNII-8 passband depicted in FIG. 14 in thick dot-dashed line may be realized by the second AW filter 22. The UNII-2c to UNII-4 passband has a rising skirt labeled E and a falling skirt labeled G. In accordance with the present disclosure, the rising skirt E and the falling skirt G have relatively shallow slopes. In this case, the falling skirt G has been given a shallower slope that spans the up to 160 MHz gap in spectrum. Moreover, in this case, the falling skirt G has substantially the same shallower slope of rising skirt E. As such, in accordance with the present disclosure, the first AW filter 14 is structured to provide the shallower slopes of the rising skirt E and the falling skirt G by taking advantage of the up to 160 MHz gap and a gap between the 5H4 frequency band and the 6E frequency band.

In contrast, a rising skirt labelled F of the UNII-5 to UNII-8 passband has a relatively steep slope in comparison with the rising skirt E of the UNII-2c to UNII-4 passband. As such, in accordance with the present disclosure, the second AW filter 22 is structured to provide the steeper slope of the rising skirt F. The skirt management configured into the first AW filter 14 provides advantages of at least smaller physical size, lower cost, and lower insertion loss in comparison with contemporary filter modules.

While the previous exemplary embodiments depict two passband filters per die, it is to be understood that a larger number of passband filters may be added per die. For example, envisioned embodiments may include three or four filters per die, and even more filters per die can be employed without straying for the scope of the present disclosure.

FIGS. 15 through 18 depict packaging arrangements for some exemplary embodiments of the filter bank module 10. It is to be understood that FIGS. 15 through 18 are not exhaustive. However, various packaging arrangements have relatively small length and width dimensions with typical length and width dimensions not exceeding 2.0 mm and typically ranging between 1.8 mm and 1.4 mm, although width dimensions can be smaller than 1.4 mm.

FIG. 15 is a packaging diagram of a first exemplary embodiment of filter bank module 10. In this first exemplary embodiment, the filter bank die 14 and the double-pole double-throw (DPDT) switch 40 are integrated together on a substrate 76, which may be a laminate substrate. In this case, the DPDT switch 40 is fabricated using radio frequency silicon-on-insulator (RFSOI) technology. The first exemplary embodiment has dimensions of 1.6 mm by 1.8 mm, which in this case, can accommodate at least two surface-mount technology (SMT) components 78 such as capacitors, inductors, diodes, discrete transistors, and resistors, or any combinations thereof. In this case, the SMTs 78 are mounted on the substrate 76 on opposing sides of the DPDT switch 40. The SMT components 78 may be used, for example, for impedance matching, passive filtering, decoupling, and/or current limiting. In this first embodiment, the filter bank die 14 has length and width dimensions of 1.6 mm by 0.8 mm, and the DPDT switch 40 has dimensions of 0.95 mm by 0.5 mm. The antenna port terminal 12 is located on an edge of the substrate 76.

FIG. 16 is a packaging diagram of a second exemplary embodiment of filter bank module 10. In this second exemplary embodiment, the filter bank die 14 and the single-pole double-throw (SPDT) switch 32 are integrated together on the substrate 76. The second exemplary embodiment has dimensions of 1.6 mm by 1.8 mm, which is large enough to accommodate at least two of the SMT components 78. In this case, the SMT components 78 are mounted on the substrate 76 adjacent to a same side of the SPDT switch 32. In this case, the SMT components 78 may be capacitors, inductors, diodes, transistors and resistors, or any combination thereof. The length and width dimensions of the filter bank die are 1.2 mm by 0.94 mm, and the SPDT switch has length and width dimensions 1.4 mm by 0.6 mm.

FIG. 17 is a packaging diagram of a third exemplary embodiment of filter bank module 10 of the present disclosure. In this third exemplary embodiment, the filter bank die 14 and the DPDT switch 40 are integrated together on the substrate 76. The third exemplary embodiment has dimensions of 1.6 mm by 1.4 mm, which is large enough to accommodate at least one of the SMT components 78. In this case, the at least one SMT component 78 is mounted on the substrate 76 adjacent to the DPDT switch 40. In this case, the one SMT component 78 may be a capacitor, an inductor, a diode, a transistor, and a resistor. The length and width dimensions of the filter bank die 14 are 1.4 mm by 1.2 mm, and the DPDT switch has length and width dimensions 1.4 mm by 0.6 mm.

FIG. 18 is a packaging diagram of a fourth exemplary embodiment of filter bank module 10 of the present disclosure. In this fourth exemplary embodiment, the filter bank die 14 and the switch die 70 are integrated together on the substrate 76. The fourth exemplary embodiment has dimensions of 1.6 mm by 1.4 mm, which is large enough to accommodate an additional filter bank die 80, which includes AW filters such as the first AW filter 16 and the second AW filter 22. An advantage of this embodiment is allocation of passbands in each of the filter bank die 14 and the additional filter bank die 80. As an example, the UNII-1 to UNII-2a passband and the UNII-2c to UNII-3 passband may be allocated to filter bank die 14, while the UNII-2c to UNII-4 passband and the UNII-5 to UNII-8 passband may be allocated to the additional filter bank die 80. These unique passband allocations allow simultaneous transmission and/or reception. For example, these unique passband allocations provide for successful transmission on the UNII-1 to UNII-2a passband and the UNII-2c to UNII-4 passband simultaneously. In another example, unique passband allocation in accordance with the present disclosure provides for successful simultaneous transmission on the UNII-2c to UNII-5 to UNII-8. In this regard, this exemplary embodiment and similar embodiments have utility in multiple inputs multiple outputs (MIMO) transceivers. For example, this exemplary embodiment may be expanded to N by N MIMO embodiments wherein N number of RF chains are available for each band. N may be a number between 1 and 16, for example.

In FIG. 18, exemplary length and width dimensions of the filter bank die 14 are 1.2 mm by 0.94 mm, and the switch die 70 has length and width dimensions 0.91 mm by 0.79 mm, and dimensions of the additional filter bank die 80 are 0.91 mm by 0.51 mm. In this case, the switch die 70 integrates the low noise amplifier 60 with the DPDT 40.

In some embodiments, the filter bank module 10 has a real estate area is no greater than 2.56 square millimeters. In other embodiments, the filter bank module 10 has a real estate area is no greater than 2.88 square millimeters. In some embodiments, the filter bank module 10 has a real estate area that is no greater than 4 square millimeters. While the packages illustrated in FIG. 15 through FIG. 18 show side-by-side assembly of dies, it should be understood that dies may be stacked without exceeding the scope of the present disclosure.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A filter bank die comprising:
   a first acoustic wave (AW) filter having a first antenna terminal and a first filter terminal, wherein the first AW filter is configured as a bandpass filter to pass a first passband with a filter skirt having a first falling slope that spans between a 100 MHz and a 160 MHz gap between adjacent passbands and a first rising slope that spans a gap less than the gap of the first falling slope; and a second AW filter configured to pass frequencies of a passband that are different from the frequencies of the first passband of the first AW filter, wherein the second AW filter has a second antenna terminal coupled to the first antenna terminal and a second filter terminal to diplex signals that pass through the first AW filter and the second AW filter; and wherein the second AW filter is configured to pass the frequencies of the second passband with a second filter skirt having a second rising slope that spans another gap between 100 MHz and 160 MHz.

2. The filter bank die of claim 1 wherein the first AW filter is configured to have a filter skirt with a slope that spans at least a 100 MHz gap between adjacent passbands.

3. The filter bank die of claim 1 wherein the second AW filter is configured to have a filter skirt with a slope that spans at least a 100 MHz gap between adjacent passbands.

4. The filter bank die of claim 1 wherein the second AW filter is configured as a bandpass filter to pass a UNII-2c to UNII-3 passband with a filter skirt having a rising slope that spans up to a 160 MHz gap between adjacent passbands.

5. The filter bank die of claim 1 wherein the first AW filter is configured as a bandpass filter to pass a UNII-1 to UNII-2a passband with a filter skirt having a falling slope that spans up to a 160 MHz gap between adjacent passbands and the second AW filter is configured as a bandpass filter to pass a UNII-2c to UNII-3 passband with a filter skirt having a rising slope that spans up to a 160 MHz gap between adjacent passbands.

6. The filter bank die of claim 1 wherein the first AW filter is configured as a bandpass filter to pass a UNII-2c to UNII-4 passband with a filter skirt having a rising slope that spans up to a 160 MHz gap between adjacent passbands.

7. The filter bank die of claim 1 wherein the second AW filter is configured to pass a UNII-5 to UNII-8 passband while rejecting the UNII-2c to UNII-4 passband.

8. The filter bank die of claim 1 wherein the first AW filter is configured as a bandpass filter to pass a UNII-2c to UNII-4 passband with a filter skirt having a rising slope that spans up to a 160 MHz gap between adjacent passbands and the second AW filter is configured to pass a UNII-5 to UNII-8 passband while rejecting the UNII-2c to UNII-4 passband.

9. The filter bank die of claim 1 wherein the first antenna terminal and the second antenna terminal are directly coupled together.

10. The filter bank die of claim 1 integrated into a filter bank module comprising a single-pole double-throw switch having a first throw terminal coupled to the first filter terminal and a second throw terminal coupled to the second filter terminal and a single pole terminal.

11. The filter bank die of claim 1 integrated into a filter bank module comprising a double-pole double-throw switch having a first throw terminal coupled to the first filter terminal and a second throw terminal coupled to the second filter terminal, a transmit pole terminal, and a receive pole terminal.

12. The filter bank die of claim 11 wherein the double-pole double-throw switch is configured to selectively couple the receive pole terminal between the first throw terminal and the second throw terminal.

13. The filter bank die of claim 11 wherein the double-pole double-throw switch is configured to selectively couple the transmit pole terminal between the first throw terminal and the second throw terminal.

14. The filter bank die of claim 11 wherein the filter bank module further comprises a low-noise amplifier (LNA) having an LNA input terminal coupled to the receive pole terminal and an LNA output terminal.

15. The filter bank die of claim 14 wherein the filter bank module further comprises a power amplifier (PA) having a PA output coupled to the transmit pole terminal and a PA input.

16. The filter bank die of claim 1 wherein the filter bank module further comprises a passive filter having a third antenna terminal coupled to an antenna port and a third filter terminal.

17. The filter bank die of claim 16 wherein the passive filter comprises at least one inductor and at least one capacitor.

18. The filter bank die of claim 16 wherein the third antenna terminal is coupled directly to both the first antenna terminal and the second antenna terminal.

19. The filter bank die of claim 16 wherein the filter bank module further comprises a single-pole double-throw switch having a first throw terminal coupled to the first filter terminal and a second throw terminal coupled to the second filter terminal and a single pole terminal.

20. The filter bank die of claim 16 wherein the filter bank module further comprises a double-pole double-throw switch having a first throw terminal coupled to the first filter terminal and a second throw terminal coupled to the second filter terminal, a transmit pole terminal, and a receive pole terminal.

21. The filter bank die of claim 20 wherein the double-pole double-throw switch is configured to selectively couple the receive pole terminal between the first throw terminal and the second throw terminal.

22. The filter bank die of claim 20 wherein the double-pole double-throw switch is configured to selectively couple the transmit pole terminal between the first throw terminal and the second throw terminal.

23. The filter bank die of claim 20 wherein the filter bank module further comprises a low-noise amplifier (LNA) having an LNA input terminal coupled to the receive pole terminal and an LNA output terminal.

24. The filter bank die of claim 23 wherein the further comprising a power amplifier (PA) having a PA output coupled to the transmit pole terminal and a PA input.

25. The filter bank die of claim 20 wherein an insertion loss between either of the transmit pole terminal or the receive pole terminal and an antenna port minus an insertion loss of either the first AW filter or the second AW filter is no greater than 1.2 decibels.

26. The filter bank die of claim 20 wherein a real estate area of the filter bank module is no greater than 2.56 square millimeters.

27. The filter bank die of claim 20 wherein a real estate area of the filter bank module is no greater than 4 square millimeters.

28. The filter bank die of claim 1 wherein the second filter skirt has a falling slope that is less than the gap of the second rising slope.

29. The filter bank die of claim 1 wherein the second filter skirt has a falling slope that is equal to the gap of the second rising slope.

* * * * *